(12) United States Patent
Sarin et al.

(10) Patent No.: US 9,236,146 B2
(45) Date of Patent: *Jan. 12, 2016

(54) SINGLE CHECK MEMORY DEVICES AND METHODS

(71) Applicant: Micron Technology, Inc., Boise, ID (US)

(72) Inventors: Vishal Sarin, Cuprertino, CA (US); Aaron Yip, Santa Clara, CA (US); Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,736

(22) Filed: Apr. 28, 2014

(65) Prior Publication Data

US 2014/0351663 A1 Nov. 27, 2014

Related U.S. Application Data

(63) Continuation of application No. 12/975,494, filed on Dec. 22, 2010, now Pat. No. 8,711,616.

(51) Int. Cl.
| | | |
|---|---|---|
| G11C 11/34 | (2006.01) | |
| G11C 29/50 | (2006.01) | |
| G11C 11/56 | (2006.01) | |
| G11C 16/34 | (2006.01) | |
| G11C 16/04 | (2006.01) | |

(52) U.S. Cl.
CPC ...... *G11C 29/50004* (2013.01); *G11C 11/5628* (2013.01); *G11C 16/3459* (2013.01); *G11C 16/0483* (2013.01); *G11C 2029/5004* (2013.01); *G11C 2211/5621* (2013.01)

(58) Field of Classification Search
CPC .............. G11C 16/0483; G11C 16/10; G11C 11/5628; G11C 2211/5621; G11C 16/06; G11C 16/28; G11C 13/004; G11C 2211/5641; G11C 2211/5644
USPC ............ 365/185.03, 185.12, 185.14, 185.17, 365/185.18, 185.19, 185.2, 185.22, 185.24, 365/185.28, 185.33
See application file for complete search history.

(56) References Cited

U.S. PATENT DOCUMENTS

| | | |
|---|---|---|
| 8,711,616 B2 | 4/2014 | Sarin et al. |
| 2007/0109854 A1 | 5/2007 | Shibata |
| 2010/0208524 A1* | 8/2010 | Sarin et al. ............... 365/185.19 |
| 2012/0163076 A1 | 6/2012 | Sarin et al. |

* cited by examiner

*Primary Examiner* — Fernando Hidalgo
(74) *Attorney, Agent, or Firm* — Schwegman Lundberg & Woessner, P.A.

(57) ABSTRACT

Memory devices and methods of operating memory devices are shown. Configurations described include circuits to perform a single check between programming pulses to determine a threshold voltage with respect to desired benchmark voltages. In one example, the benchmark voltages are used to change a programming speed of selected memory cells.

17 Claims, 7 Drawing Sheets

SINGLE CHECK MEMORY DEVICES AND METHODS

PRIORITY APPLICATION

This application is a continuation of U.S. application Ser. No. 12/975,494, filed Dec. 22, 2010, which is incorporated herein by reference in its entirety.

BACKGROUND

Non-volatile memory devices such as flash memory devices are used in many computers and electronic devices to store information (e.g. data). A flash memory device usually has a programming operation to store data, a read operation to retrieve the stored data, and an erase operation to clear data from the memory. These programming, read, and erase operations often involve applying various voltages to different parts of the memory device.

A conventional non-volatile memory device may go through many programming, read, and erase operations during its life. Thus, improper control of the voltages applied to the device during these operations may lead to inferior device performance, reliability, or both.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical changes, etc. may be made.

Figure 1:
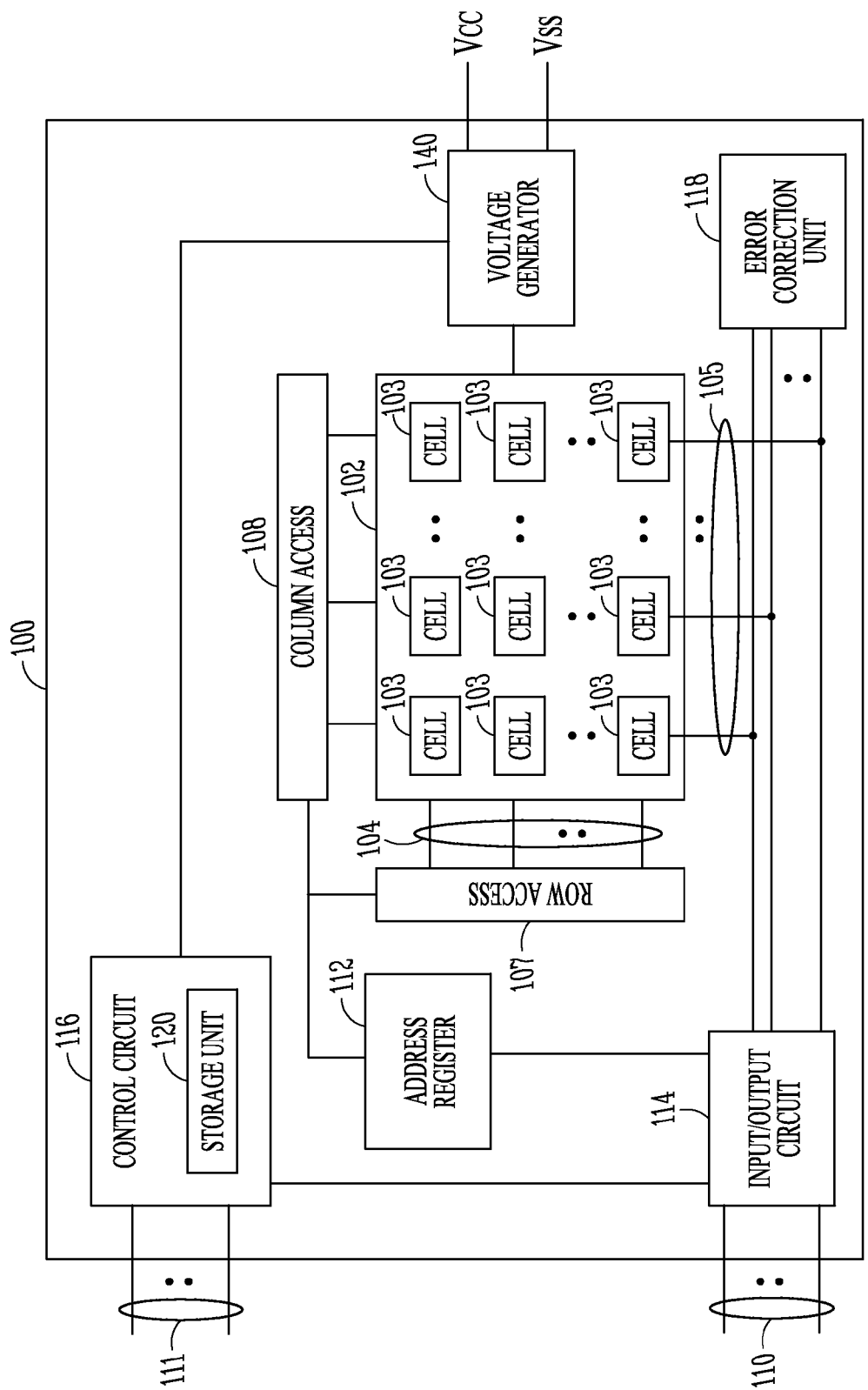
FIG. 1 shows a block diagram of a memory device, according to an embodiment of the invention.

FIG. 1 shows a block diagram of a memory device 100 according to an embodiment of the invention. Memory device 100 includes a memory array 102 with memory cells 103 that may be arranged in rows and columns along with access lines 104 and data lines 105. Memory device 100 can use access lines 104 to access memory cells 103 and data lines 105 to transfer information with memory cells 103. Row access 107 and column access circuitry 108 respond to an address register 112 to access memory cells 103 based on row address and column address signals on terminals 110, 111, or both. A data input/output circuit 114 transfers data between memory cells 103 and terminals 110. Terminals 110 and 111 may be external terminals of memory device 100 (e.g., terminals exposed outside a chip or semiconductor package that contains memory device 100).

A control circuit 116 controls operations of memory device 100 based on signals present on terminals 110 and 111. A device (e.g., a processor or a memory controller) external to memory device 100 may send different commands (e.g., programming commands and read commands) to memory device 100 using different combinations of signals on terminals 110, 111, or both.

Memory device 100 responds to commands to perform operations such as programming, read, and erase operations. A programming operation may write data from terminals 110 to memory cells 103 (e.g., transfer data from terminals 110 to memory cells 103). The programming operation can generally be called a write operation. A read operation reads data from memory cells 103 to terminals 110 (e.g., transfer data from memory cells 103 to terminals 110). An erase operation erases data (e.g., clears data) from all memory cells 103 or from a portion of memory cells 103.

Memory device 100 receives supply voltages Vcc and Vss. Vcc may include a positive voltage value, and Vss may include a ground potential. Memory device 100 can also include a voltage generator 140. Voltage generator 140 and control circuit 116 operate to provide different voltages to memory array 102 or to cause memory array 102 to receive different voltages during the operations (e.g., programming operations) of memory device 100.

Memory device 100 may include an error correction unit 118 to check for errors in information read from memory cells 103. Error correction unit 118 may include error correction circuitry to correct errors based on an error correction code (ECC), as is well-known to those of ordinary skill in the art.

Memory device 100 may include a storage unit 120, which may include memory elements such as registers. Storage unit 120 may include a hardware portion, a firmware portion, or both, of memory device 100. Storage unit 120 may also be used to store codes (e.g., software programming instructions).

Memory device 100 can be a flash memory device such as a NAND flash or a NOR flash memory device, and other kinds of memory devices.

Memory device 100 can be a single-level-cell memory device such that memory cells 103 store information to represent a value of a single bit of data. For example, memory cells 103 may store information that represents either a binary "0" value or a binary "1" value of a single bit of data.

Memory device 100 can be a multi-level-cell (MLC) memory device such that each of memory cells 103 can store information represented by a value corresponding to multiple bits of data (e.g., a value corresponding to two, three, four, or some other number of bits of data). For example, when each of memory cells 103 corresponds to a 2-bit per cell, each of memory cells 103 may store information to represent a value corresponding to one of four possible combinations of two binary bits of data (i.e., combination 00, 01, 10, and 11 corresponding to two bits of data). In another example, when each of memory cells 103 corresponds to a 3-bit per cell, each of memory cells 103 may store information to represent a value corresponding to one of eight possible combinations of three binary bits of data (i.e., one of 000, 001, 010, 011, 100, 101, 110, and 111). In another example, when each of memory cells 103 corresponds to a four-bit per cell, each of memory cells 103 may store information to represent one of 16 possible combinations of four binary bits of data (i.e., one of 0000, 0001, 0010, 0011, 1000, and so on, up to 1111).

Single level and MLC memory devices may be combined within the device 100. One of ordinary skill in the art will readily recognize that memory device 100 can include other parts, which are omitted from FIG. 1 to help focus on the various embodiments described herein. Memory device 100 may include one or more of the embodiments described below with reference to FIG. 2 through FIG. 9.

Figure 2:
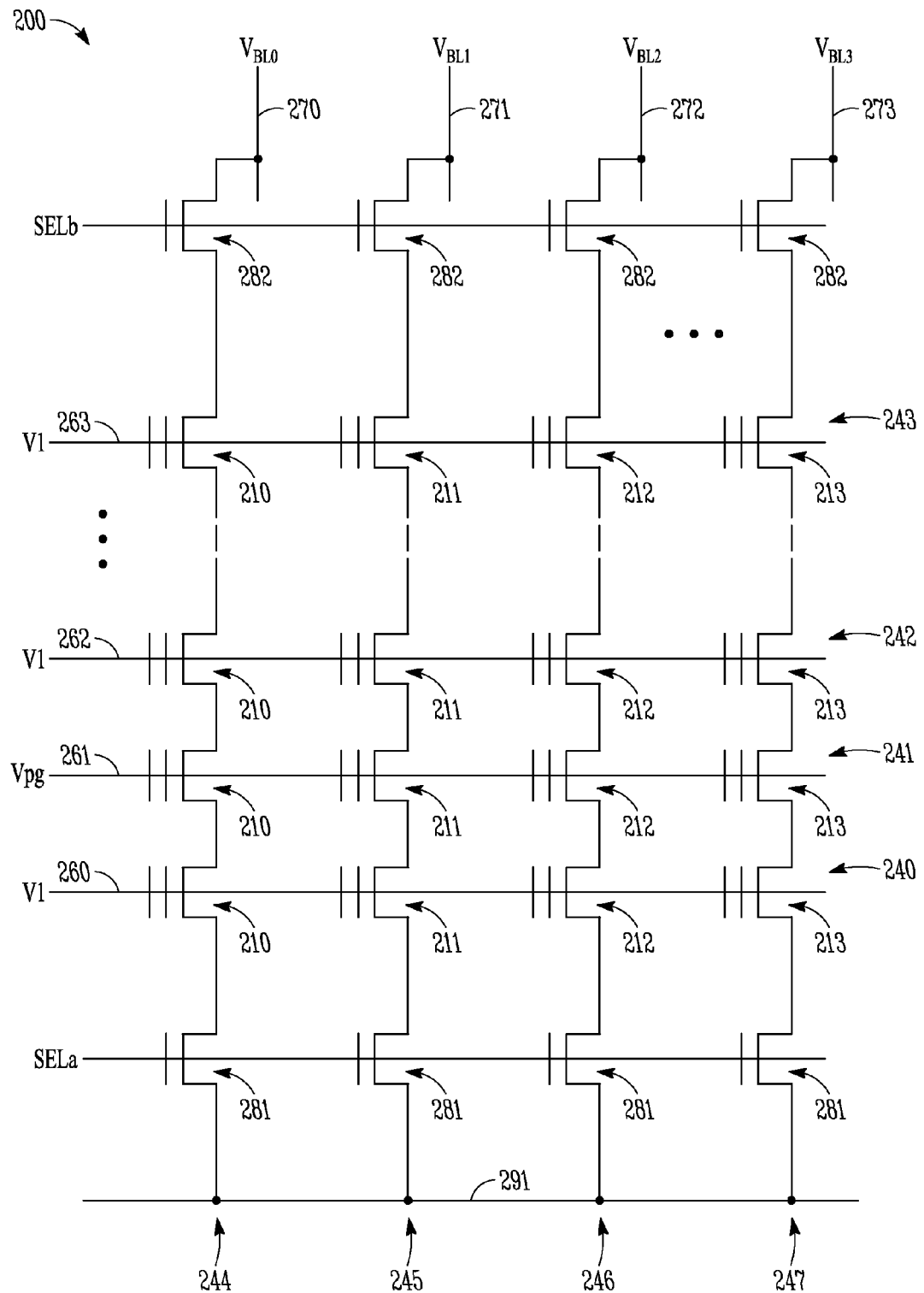
FIG. 2 shows a partial schematic diagram of a memory device, according to an embodiment of the invention.

FIG. 2 shows a partial schematic diagram of a memory device 200 according to an embodiment of the invention. Memory device 200 can be associated with memory device 100 of FIG. 1, such as forming a portion of memory array 102 of memory device 100. In FIG. 2, memory device 200 includes memory cells 210, 211, 212, and 213, arranged in rows 240, 241, 242, and 243, and columns 244, 245, 246, and 247. At least some of the memory cells in the same column may be connected in a series (sometimes called a string) of memory cells in their respective column, as illustrated in FIG. 2. FIG. 2 shows an example of four rows and four columns with four memory cells in each column. The number of rows, columns, and memory cells may vary.

As shown in FIG. 2, the memory cells in the same row (e.g., row 241) can be coupled to one of access lines 260, 261, 262, and 263. These access lines can correspond to portions of word lines of a memory device. Memory device 200 uses access lines 260, 261, 262, and 263 to access memory cells 210, 211, 212, and 213 during a read operation to read information stored in memory cells 210, 211, 212, and 213, and during a programming operation to store (e.g., program) information into memory cells 210, 211, 212, and 213. Memory device 200 uses lines 270, 271, 272, and 273 to transfer the information read from these memory cells during a read operation. Memory device 200 also includes transistors 281 and 282 (responsive to signals SELa and SELb, respectively) to couple the memory cells in columns 244, 245, 246, and 247 to data lines 270, 271, 272, and 273, respectively. Data lines 270, 271, 272, and 273 may correspond to portions of bit lines of a memory device. Line 291 may correspond to a portion of a source (voltage) line of a memory device.

Memory device 200 stores information into memory cells 210, 211, 212, and 213 in a programming operation. The information stored in a particular memory cell (e.g., one of memory cells 210, 211, 212, and 213) is indicated by the threshold voltage value of that particular memory. For a multi-level-cell memory cell, the cell can be programmed to a threshold voltage value in one of a number of ranges that each represents, for example, a respective one of the possible combinations of multiple bits that can be stored in that memory cell. For example, when each of memory cells 210, 211, 212, and 213 corresponds to a 3-bit per cell, each of these memory cells can be programmed to a threshold voltage value in one of eight different threshold voltage ranges to represent a value corresponding to one of eight possible combinations of three binary bits of data (i.e., one of 000, 001, 010, 011, 100, 101, 110, and 111).

During a programming operation, memory device 200 may apply different voltages (e.g., voltages Vpg and V1) to access lines 260, 261, 262, and 263 to store information into selected memory cells among the memory cells of memory device 200. In the description herein, selected memory cells refer to the memory cells that are selected to store information in a particular programming operation, and unselected memory cells refer to the memory cells that are not selected to store information in that particular programming operation. The values (e.g., corresponding to a memory address) of the signals on terminals, such as terminals 110 and 111 of FIG. 1, can be used to determine which memory cells are selected to be programmed in a programming operation.

FIG. 2 shows an example where one or more memory cells 210, 211, 212, and 213 in row 241 are selected memory cells to store information in a programming operation. The memory cells in rows 240, 242, and 243 are unselected memory cells. As shown in the example of FIG. 2, during a programming operation, memory device 200 applies voltage Vpg to access line 261 associated with the selected memory cells in row 241 and applies the voltage V1 to other access lines 260, 262, and 263 associated with unselected memory cells in rows 240, 242, and 243. Memory device may also apply voltages $V_{BL0}$, $V_{BL1}$, $V_{BL2}$, and $V_{BL3}$ with different values to data lines 270, 271, 272, and 273, respectively.

In the example shown in FIG. 2, memory device 200 may use a substantially constant value for voltage V1 (e.g., approximately ten volts) to cause the unselected memory cells to operate as pass elements during a programming operation. Memory device 200 may use a value from approximately 15 volts to approximately 20 volts for voltage Vpg to program selected memory cells with threshold voltage values to represent information store therein.

Figure 3:
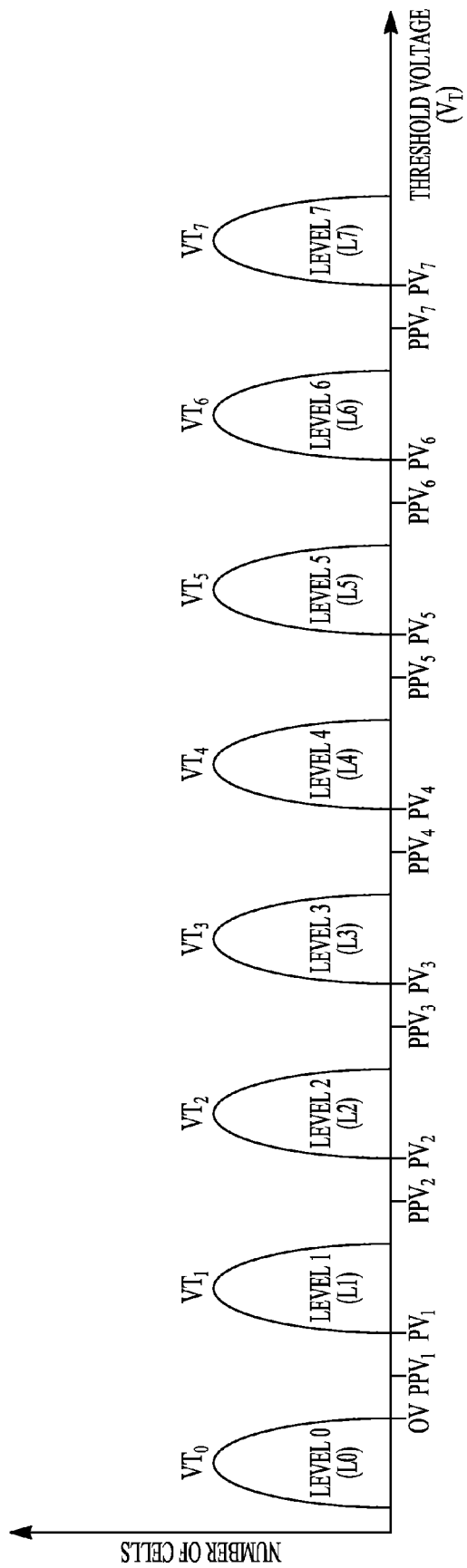
FIG. 3 shows an example of threshold voltage distributions for a memory device, according to an embodiment of the invention.

FIG. 3 shows an example of threshold voltage distributions of memory device 200 of FIG. 2, according to an embodiment of the invention. As described above, memory device 200 can be a multi-state cell memory device. For example, memory device 200 can be a 3-bit per cell memory device, where there are eight possible combinations of 3 bits. FIG. 3 shows eight states (e.g. which are sometimes called states), state 0 (L0) through state 7 (L7) corresponding to eight different combinations of 3 bits. Each state has a corresponding voltage threshold value range for a large number of memory cells. For example, each of states L0 through L7 has a corresponding range of threshold voltage values, each such range being labeled with a representative value of $VT_0$ through $VT_7$, respectively, of that range. As shown in FIG. 3, the value of $VT_0$ through $VT_7$ go from lowest threshold voltage value (corresponding state 0) to highest threshold voltage value (corresponding to state 7). Thus, the value of threshold voltage $VT_7$ is greatest among the threshold voltages $VT_0$ through $VT_7$.

Each state in FIG. 3 has associated verify voltages, such as pre-program verify voltage $PPV_i$ and program verify voltage $PV_i$, where index i corresponding to the state number. For example, state 6 has associated verify voltages $PPV_6$ and $PV_6$. State 7 has associated verify voltages $PPV_7$ and $PV_7$. As shown in FIG. 3, each of verify voltages $PPV_i$ and $PV_i$ of a particular state is greater than the threshold voltage value of all the repectively lower states. For example, each of $PPV_7$ and $PV_7$ of state 7 is greater than the value of threshold voltage $VT_6$ (corresponding to state 6), as well as the values of threshold voltages corresponding to states 0-5.

Memory device 200 can use verify voltages $PPV_i$ and $PV_i$ during a verify operation within the programming operation to determine whether a memory cell being programmed has reached its target threshold voltage value during the programming operation. A verify operation can include sensing the memory cell and comparing its threshold voltage value with verify voltages $PPV_i$ and $PV_i$. A memory cell has reached its target threshold voltage value if its threshold voltage value exceeds its associated verify voltage $PV_i$. If the memory cell has not reached its target threshold voltage value, then the programmed operation and verify operation are repeated until the threshold voltage value of the memory cell exceeds its associated verify voltage $PV_i$. Each time the programming operation repeats programming a memory cell, the value of the of the programming pulse (e.g., Vpg in FIG. 2) applied to the memory cell being programmed can be increased. Each time the programming operation repeats programming a memory cell, the value of the voltage on the data line (e.g., $V_{BL0}$, $V_{BL1}$, $V_{BL2}$, or $V_{BL3}$ in FIG. 2) associated with the memory cell being programmed can remain the same or can be changed (increased or decreased), based on the threshold voltage value of the memory cell, as explained in more detail with reference to FIG. 4 through FIG. 5.

In FIG. 3, for example, if a particular memory cell is to be programmed to have a threshold voltage value corresponding to state 6, then during a programming operation, memory device 200 can perform a verify operation to compare the threshold voltage of that particular memory cell with verify voltages $PPV_6$ and $PV_6$. In this example, the particular memory cell has reached its target threshold voltage value if the threshold voltage of that particular memory cell during the programming operation exceeds verify voltage $PV_6$. If the threshold voltage of that particular memory cell during the programming operation does not exceed verify voltage $PV_6$ during the verify operation, meaning that the particular memory cell has not reached its target threshold voltage value, then the programming operation and verify operation are repeated until the threshold voltage value of that memory cell exceeds its associated verify voltage $PV_6$.

Figure 4A:
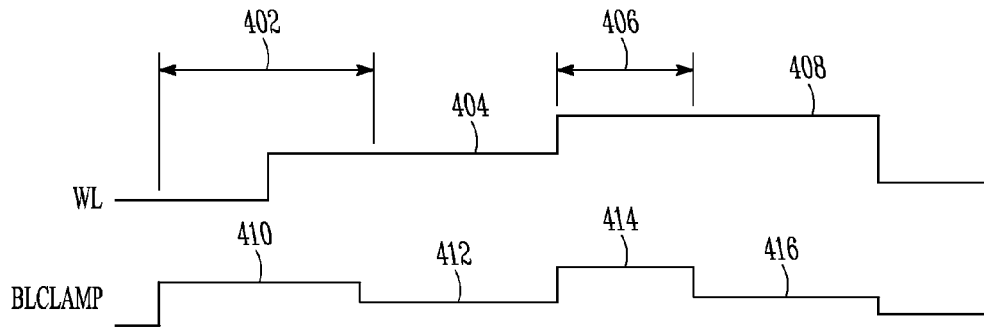
FIG. 4A shows a diagram of a two check operation for a memory device according to an embodiment of the invention.

FIG. 4A illustrates one example of a two check operation. After a programming pulse, the threshold voltage is checked twice to determine if additional programming pulses are needed. In FIG. 4A, a wordline voltage is raised to a first state 404 for a time 402, while a bitline is precharged to state 410. The bitline state is then checked at a first check state 412 to determine if the threshold voltage has reached PPV. The wordline is then raised to a second state 408 for a time 406, while a bitline is precharged to state 414. The bitline state is then checked at a second check state 416 to determine if the threshold voltage has reached PV.

A number of operations can be triggered in response to detection of a state of the threshold voltage. In one embodiment, if the threshold voltage has reached PPV, programming is modified to make programming of the threshold voltage slower in that particular cell during the next programming pulse. Other cells may be programmed at different speeds depending on their status compared to PPV. In one embodiment, programming is slowed during the next program pulse by raising the bitline voltage by a selected amount.

In one embodiment, if the threshold voltage has reached PV, programming is modified to inhibit further programming of the threshold voltage in that particular cell during the next programming pulse. Other cells may be programmed at different speeds depending on their status compared to PV. In one embodiment, programming is inhibited during the next program pulse by raising the bitline voltage by a selected amount higher than the amount used to slow the programming.

In one embodiment, if other cells on a common wordline have reached their target threshold voltage values, and a cell on the common wordline remains to be programmed, the programming for the remaining cell can be sped up. In one example, a bitline voltage associated the cell that remains to be programmed can be lowered to speed up programming. In one example, the bitline voltage can be lowered to approximately zero volts. In one example, the bitline voltage can be lowered to a state that is greater than zero volts.

Figure 4B:
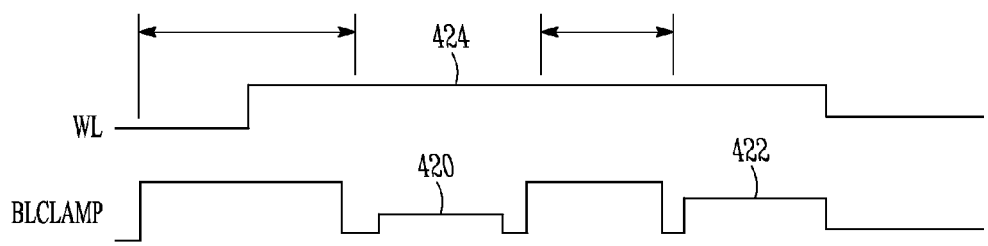
FIG. 4B shows another diagram of a two check operation for a memory device according to an embodiment of the invention.

FIG. 4B shows another example of a two check operation. In FIG. 4B, a wordline voltage is raised to a state 424. In FIG. 4B the bitline is raised to two different states 420, 422 to check the threshold voltage in comparison to PPV and PV. In both examples of FIG. 4A and FIG. 4B, two checks are required between each programming pulse, one check for PPV and a second check for PV.

Figure 5:
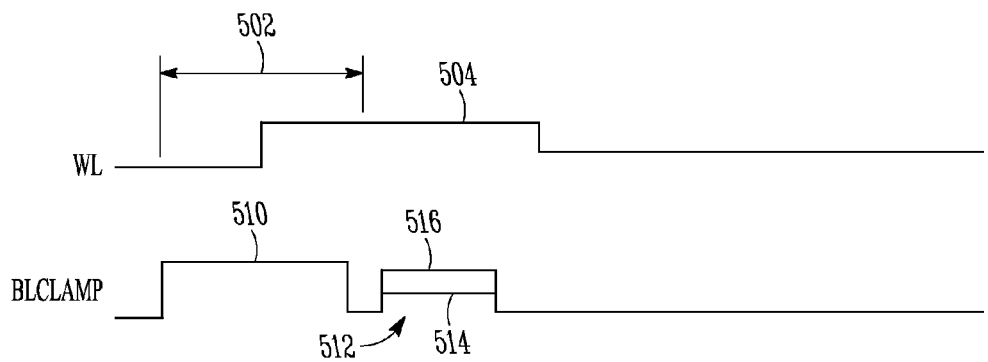
FIG. 5 shows a diagram of a one check operation for a memory device according to an embodiment of the invention.

FIG. 5 shows a one check operation according to an embodiment of the invention. In FIG. 5, a wordline voltage is raised to a voltage state 504, while a bitline is precharged to state 510, over a time period 502. The bitline state is then checked once at operation 512. As will be described in more detail below, a latch circuit is used to check either PPV state 514, or PV state 516, depending on a state of the latch.

Figure 6:
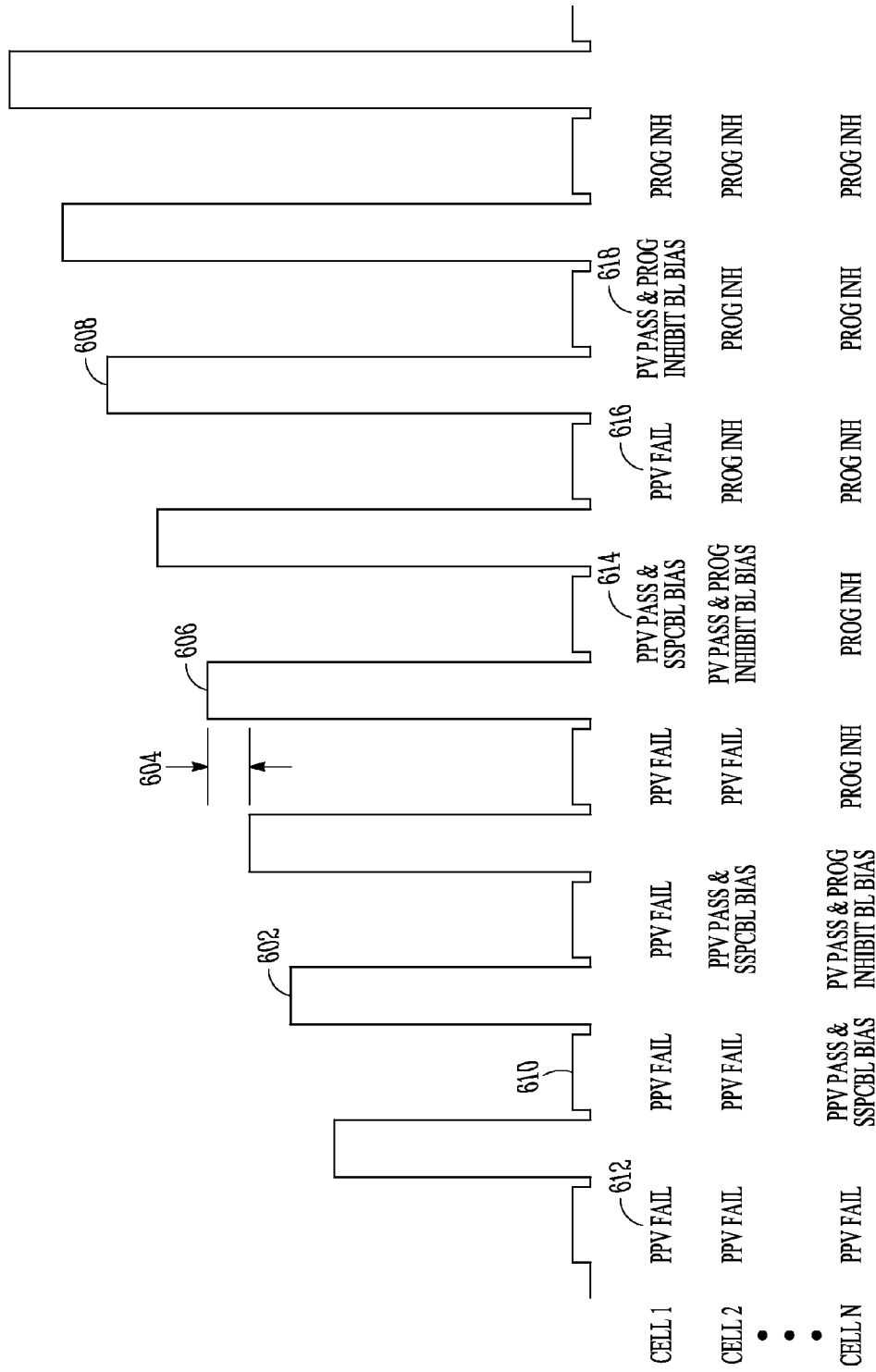
FIG. 6 shows a graph indicating programming voltages and threshold voltage states for memory cells during a programming operation, according to an embodiment of the invention.

FIG. 6 shows an illustration of a method to check (e.g. verify) a threshold voltage (VT) of a memory cell according to an embodiment of the invention. A number of programming pulses 602 are shown to program a threshold voltage in a memory cell. One or more programming pulses may be used to reach the desired threshold voltage. The number of programming pulses necessary can depend on a number of factors such as material variation, manufacturing variation, etc. Some cells will program faster or slower than other cells. Using the check routines described, programming can be slowed down or stopped in faster programming cells. If selected conditions are met, programming can also be sped up.

This process prevents cells that have already reached their desired threshold voltage from over programming.

In one example, a programming voltage is incremented by a value 604 after each pulse. In one embodiment, a threshold voltage is checked after each pulse 602 to determine the programming effect of each pulse 602 on the memory cell. FIG. 6 illustrates a number of single threshold voltage checks 610 between each pulse.

As described above, in operating memory devices such as multistate memory devices, it may be useful to know a value of the threshold voltage compared to two or more benchmark voltages such as a pre-program voltage (PPV) and a program voltage (PV). Multiple checks can be used to determine the threshold voltage with reference to these benchmark voltages at various times during programming. In one embodiment, a single check is used between programming pulses 602 to determine the threshold voltage with reference to benchmark voltages such as PPV and PV.

FIG. 6 illustrates logically the states that are determined at each single check 610 for a number of cells 1, 2, 3, . . . , N. For cell 1, single check 612 indicates that VT of cell 1 is below a selected PPV. The next thee single checks 610 between incrementally higher voltage pulses 602 also show VT for cell 1 below a selected PPV. Single check 614 indicates that after programming pulse 606, the threshold voltage is now above PPV. In one embodiment, this state of the threshold voltage is stored (e.g. latched) in a latch circuit. In one example, the latch circuit is a static latch that maintains its state without any periodic refreshing. In one example the latch circuit is a dynamic latch, whose state is periodically refreshed.

In one embodiment, the latching of the state in single check 614 also changes a bitline voltage for cell 1 from a fast programming voltage to a slower programming voltage. In one embodiment, the fast programming voltage is a ground voltage and the slower programming voltage is a higher voltage such as 500 mV.

Subsequent single check 616 indicates that the threshold voltage for cell 1 is below PV. At check 616, the circuit remains latched, and the bitline voltage for cell 1 remains at a slower programming voltage. Single check 618 indicates that after programming pulse 608, the threshold voltage is now above PV. In one embodiment, this state of the threshold voltage is stored in the same latch circuit.

In one embodiment, the latching of the state in single check 618 also changes a bitline voltage for cell 1 from a slow programming voltage to a programming inhibit voltage. In one embodiment, the programming inhibit voltage is 6V. As shown in FIG. 6, in one example the latch circuit retains the programming inhibit voltage for subsequent single check operations after the threshold voltage for cell 1 has exceeded PV.

Additional examples are shown in FIG. 6 for cell 2 and cell N, indicating that PPV and PV benchmark voltages are reached at different programming pulses 602 for different cells, depending on the logical state that is selected for each cell.

Figure 7:
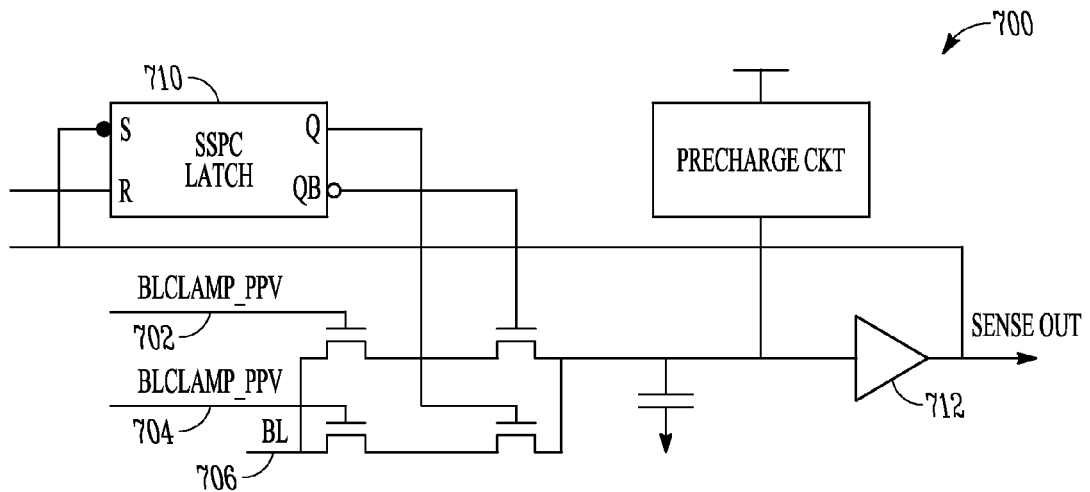
FIG. 7 shows a circuit for checking a threshold voltage of a memory cell according to an embodiment of the invention.

FIG. 7 shows an embodiment of a circuit 700 used to check (e.g. detect) threshold voltage (VT) and determine what state the threshold voltage (VT) for a given memory cell is in (e.g. VT<PPV; PPV<VT<PV; VT>PV). FIG. 7 illustrates a line 702 to set a desired PPV, and a line 704 to set a desired PV. As discussed in FIG. 3 above, PPV and PV vary for each desired logical state in a multistate cell. FIG. 7 shows a line 706 coupled to a given bitline in a memory device such as the device from FIG. 2. In one example the bitline is checked a single time between programming pulses, as described in FIG. 6 above. A latch 710 is shown in the circuit 700 to latch a state of the threshold voltage being checked. In the example of FIG. 7, a single sense amplifier 712 is used to check the state of the threshold voltage, and change the state of the latch 710. In selected embodiments, a current sense amplifier 712 is used. In other embodiments, a voltage sense amplifier 712 is used.

Figure 8:
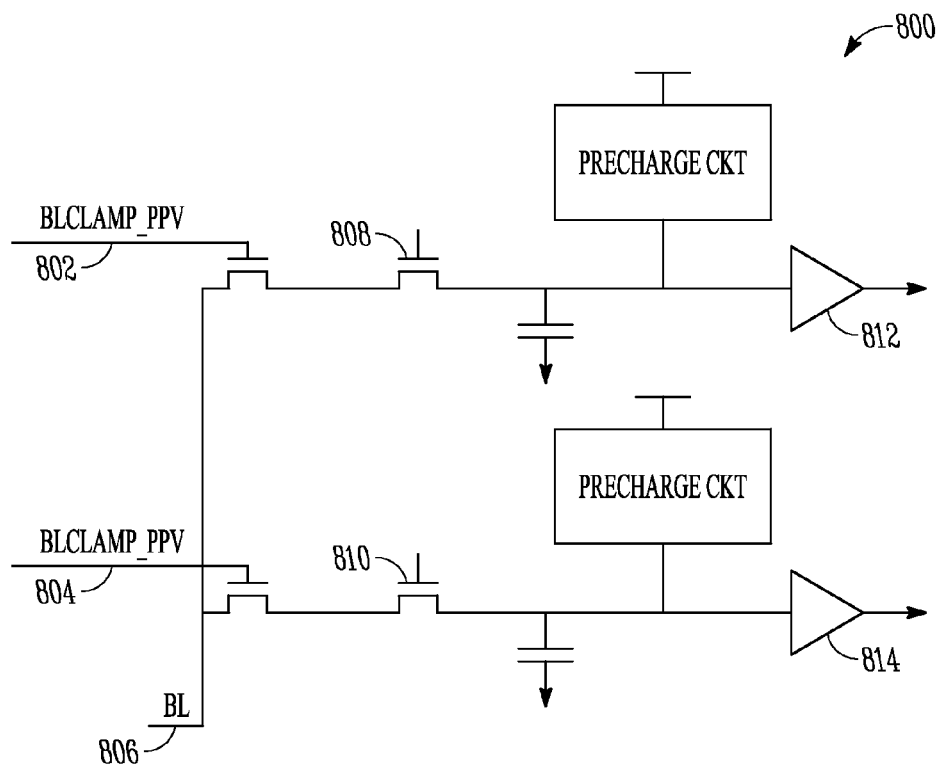
FIG. 8 shows another circuit for checking a threshold voltage of a memory cell according to an embodiment of the invention.

FIG. 8 shows another embodiment of a circuit 800 used to check threshold voltage (VT) and determine what state the threshold voltage for a given memory cell is in. FIG. 8 illustrates a line 802 to set a desired PPV, and a line 804 to set a desired PV. FIG. 8 shows a line 806 coupled to a given bitline in a memory device such as the device from FIG. 2. In one example the threshold voltage is checked a single time between each programming pulse, as described in FIG. 6 above. In one embodiment, a latch similar to the latch in FIG. 7 (not shown in FIG. 8) is used to latch a state of the threshold voltage being checked. Transistor 808 is coupled to the latch to indicate PPV, and transistor 810 is coupled to the latch to indicate PV. In the example of FIG. 8, a first sense amplifier 812 is used to detect threshold voltage compared to PPV, and a second sense amplifier 814 is coupled in parallel to detect threshold voltage compared to PV. Both the first sense amplifier 812 and the second sense amplifier 814 are coupled to the latch (not shown) to change its state accordingly.

Using the configuration of FIG. 8, if a target threshold voltage is reached in a given cell after only a single programming pulse, the circuit 800 will detect, using a single check, that both PPV and PV have been met. Using the configuration of FIG. 8, two sense amplifiers (812, 814) are required. Using the configuration of FIG. 7, only a single sense amplifier 712 is needed, although two programming pulse iterations 602 are used to first latch the PPV state, then subsequently latch the PV state.

Figure 9:
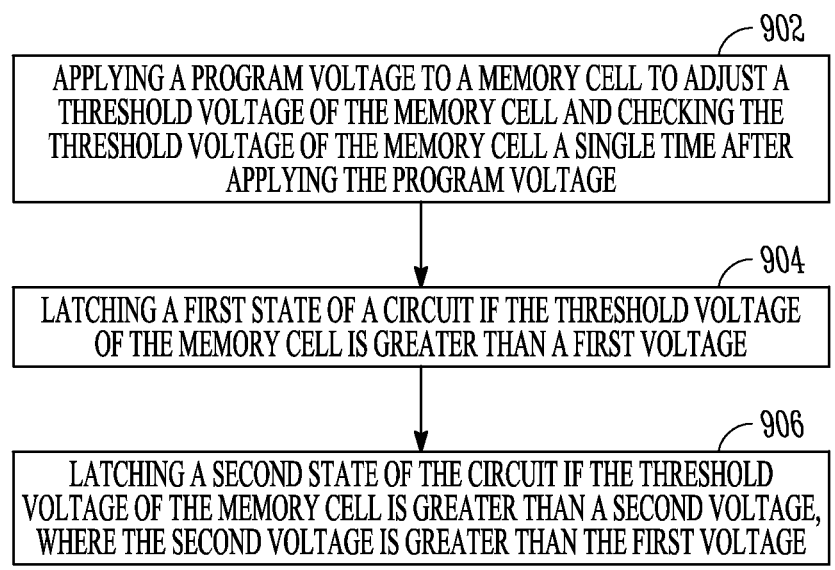
FIG. 9 shows a method of operating a memory device according to an embodiment of the invention.

FIG. 9 shows a method of operating a memory device according to an embodiment of the invention. In operation 902, a program voltage is applied to a memory cell to adjust a threshold voltage of the memory cell, and a threshold voltage of the memory cell is checked a single time after applying the program voltage.

Operation 904 recites latching a first state of a circuit if the threshold voltage of the memory cell is greater than a first voltage. In one example, the first state indicates that the threshold voltage is above PPV. Operation 906 recites latching a second state of the circuit if the threshold voltage of the memory cell is greater than a second voltage, where the second voltage is greater than the first voltage. In one example, the second state indicates that the threshold voltage is above PV.

By detecting a threshold voltage above PPV, programming of the memory cell can be slowed selectively, for example by raising a bitline voltage from ground to a higher value. By later detecting a threshold voltage above PV, programming can be stopped for a given memory cell. In embodiments with the described threshold voltage checking and programming speed adjustment, variations between memory cells can be accounted for, and memory devices with more reliable programming are provided.

Embodiments described with a single verify threshold voltage circuit improve efficiency and device speed over other configurations that require multiple checks to determine threshold voltage with respect to multiple benchmarks such as PPV and PV.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A memory device, comprising:
   a multistate memory cell;
   a threshold voltage check circuit coupled to a data line of the multistate memory cell, and configured to check a threshold voltage of the memory cell a single time between incremented programming pulses, wherein the threshold voltage check circuit is configured to store a first value responsive to the threshold voltage reaching a first threshold voltage, and a second value instead of the first value, responsive to the threshold voltage reaching a second threshold voltage, the second threshold voltage being higher than the first threshold voltage; and
   a programming voltage circuit to slow a programming rate of the memory cell if the first value is stored or inhibit further programming of the memory cell if the second value is stored.

2. The memory device of claim 1, wherein the threshold voltage check circuit includes a latch to store either the first value, or the second value.

3. The memory device of claim 2, wherein the latch is coupled to a single sense amplifier to detect the threshold voltage.

4. The memory device of claim 2, wherein the latch is coupled to a pair of sense amplifiers to detect the threshold voltage.

5. The memory device of claim 1, wherein the multistate memory cell is a two bit memory cell.

6. The memory device of claim 1, wherein the multistate memory cell is a three bit memory cell.

7. The memory device of claim 1, wherein the multistate memory cell is a four bit memory cell.

8. A multistate memory device, comprising:
- a threshold voltage check circuit configured to check a threshold voltage of one or more memory cells a single time between incremented programming pulses, wherein the threshold voltage check circuit is configured to store a first value responsive to the threshold voltage reaching a first threshold voltage, and a second value instead of the first value, responsive to the threshold voltage reaching a second threshold voltage, the second threshold voltage being higher than the first threshold voltage; and
- a programming voltage circuit to slow a programming rate of the memory cell if the first value is stored or inhibit further programming of the memory cell if the second value is stored.

9. The multistate memory device of claim 8, wherein the threshold voltage check circuit includes a latch to store either the first value, or the second value.

10. The multistate memory device of claim 9, wherein the latch is a static latch.

11. The multistate memory device of claim 9, wherein the latch is a dynamic latch.

12. The multistate memory device of claim 8, wherein the multistate memory device is configured to store one of eight possible threshold voltage states in each memory cell.

13. A multistate memory device, comprising:
- a first programming line coupled to a memory cell to provide a pre-programming voltage;
- a second programming line coupled to the memory cell to provide a program voltage lower than the pre-programming voltage;
- a latch configured to select either the first programming line or the second programming line; and
- a first sense amplifier coupled to the latch and configured to check a threshold voltage of one or more memory cells a single time between incremented programming pulses and store a first value in the latch responsive to the threshold voltage reaching a first threshold voltage, and a second value instead of the first value, responsive to the threshold voltage reaching a second threshold voltage, the second threshold voltage being higher than the first threshold voltage.

14. The multistate memory device of claim 13, wherein the first sense amplifier is a current sense amplifier.

15. The multistate memory device of claim 13, wherein the first sense amplifier is a voltage sense amplifier.

16. The multistate memory device of claim 13, further including a second sense amplifier coupled to the latch.

17. The multistate memory device of claim 16, wherein the first sense amplifier is configured to detect the threshold voltage compared to the pre-programming voltage, and the second sense amplifier is configured to detect the threshold voltage compared to the program voltage.

* * * * *